United States Patent [19]

Inoue

[11] Patent Number: 5,331,595
[45] Date of Patent: Jul. 19, 1994

[54] SEMICONDUCTOR MEMORY DEVICE HAVING IO LINE PAIR TO BE EQUALIZED AND DIVIDED INTO BLOCKS AND OPERATING METHOD THEREOF

[75] Inventor: Yoshinori Inoue, Hyogo, Japan

[73] Assignee: Mitsubishi Denki Kabushiki Kaisha, Tokyo, Japan

[21] Appl. No.: 932,186

[22] Filed: Aug. 21, 1992

[30] Foreign Application Priority Data

Feb. 25, 1992 [JP] Japan .................................. 4-37859

[51] Int. Cl.$^5$ .............................................. G11C 7/00
[52] U.S. Cl. .................... 365/203; 365/230.03; 365/233.5
[58] Field of Search ................ 365/203, 230.03, 233.5, 365/227, 149

[56] References Cited

U.S. PATENT DOCUMENTS 4,926,384  5/1990  Roy ..................................... 365/203
4,977,373  11/1990  Kim ..................................... 365/203
5,214,610  5/1993  Houston ............................... 365/203

Primary Examiner—Eugene R. LaRoche
Assistant Examiner—A. Zarabian
Attorney, Agent, or Firm—Lowe, Price, LeBlanc & Becker

[57] ABSTRACT

In DRAM divided into plurality of blocks and operating on a block basis, each equalizing circuit is controlled such that release of equalization of an IO line pair is carried out only in a block having a memory cell from which data is to be read for data reading. Since a MOS transistor 40 provided between two IO lines constituting each IO line pair 2 for equalization of these lines and its release is not switched from on to off wastefully, current consumed for charge/discharge of a gate of the MOS transistor is considerably reduced compared to a conventional case.

17 Claims, 9 Drawing Sheets

FIG. 3

(a) $\overline{RAS}$ (b) EXTERNAL ADDRESS (c) WORD LINE (d) BIT LINE PAIR (e) COLUMN SELECTING LINE (f) IO LINE PAIR OF BLOCK OF SELECTED STATE (g) EQUALIZATION CONTROL SIGNAL (h) SIGNAL EQI TO EQUALIZATION TRANSISTOR CORRESPONDING TO BLOCK OF SELECTED STATE (i) IO LINE PAIR OF BLOCK OF NON-SELECTED STATE -Vcc
-0

(j) SIGNAL TO EQUALIZING TRANSISTOR CORRESPONDING TO BLOCK OF NON-SELECTED STATE

"H"
EQI————————————C("L")

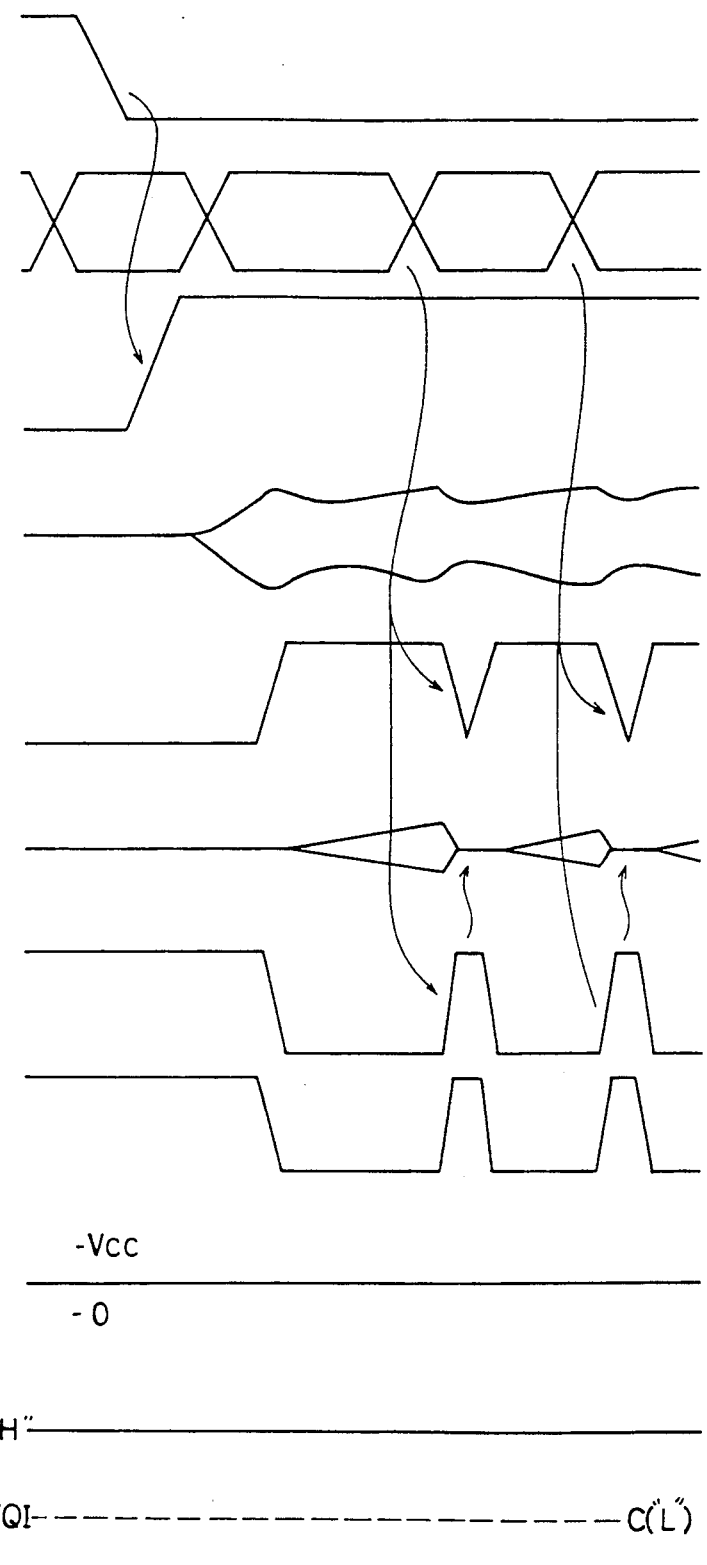

SEMICONDUCTOR MEMORY DEVICE HAVING IO LINE PAIR TO BE EQUALIZED AND DIVIDED INTO BLOCKS AND OPERATING METHOD THEREOF

BACKGROUND OF THE INVENTION

1. Field of the Invention

The present invention relates to semiconductor memory devices and, more particularly, to a semiconductor memory device in which power consumption is reduced when an input/output line pair (referred to as an IO line pair hereinafter) is equalized.

2. Description of the Background Art

In a semiconductor memory device having a larger storage capacity, a memory cell array is often divided into a plurality of blocks and, in each of these blocks, circuit operations for data writing and data reading are carried out, with a view to reducing power consumption and avoiding an increase of an access time.

FIG. 7 is a schematic block diagram showing a whole configuration of a DRAM (Dynamic Random Access Memory) having a block-divided structure which is one example of the semiconductor memory devices. Referring to FIG. 7, the whole configuration in the operation of the DRAM will be hereinafter described.

A memory cell array 1 is divided into eight blocks 101-108.

FIG. 8 is a circuit diagram showing a specific structure of each of blocks 101-108. These blocks 101-108 have the same structure, and in FIG. 8, only a structure of one block is shown as a representative.

Referring to FIG. 8, each block includes a plurality of memory cells MC arranged in a matrix of a plurality of rows and columns, a plurality of word lines WL corresponding to these plural rows, and a plurality of bit lines BL1, BL2 corresponding to these plural columns, as a main portion.

Each memory cell MC includes a MOS transistor Tr having a gate connected to word line WL corresponding to the row in which the memory cell is arranged and a drain connected to bit line BL1 or BL2 provided corresponding to the row in which the memory cell is arranged, and a capacitor C connected between the transistor Tr and a low potential source such as a cell plate. Different word lines WL are connected to a memory cell MC connected to one of two adjacent bit lines BL1 and BL2 and a memory cell MC connected to the other bit line, respectively. Two adjacent bit lines BL1 and BL2 forms one bit line pair BL.

A state in which capacitor C is charged and a state in which capacitor C is discharged respectively correspond to a state in which a stored data of memory cell MC is "1" and a state in which the data is "0".

Each block further includes sense amplifiers 14 provided corresponding to all bit line pairs BL, respectively, paired input/output lines 201, 202, a transfer gate 15 provided between the input/output line pair and respective sense amplifiers 14.

Transfer gate 15 includes two MOS transistors 151, 152 corresponding to each sense amplifier 14.

Each transistor 151 is connected between a corresponding sense amplifier 14 and IO line 201, and each transistor 152 is connected between corresponding sense amplifier 14 and IO line 202. That is, one pair of transistors 500 is connected to each sense amplifier 14 to electrically connect the sense amplifier to two data lines 201, 202.

Each block further includes a row decoder 12 controlling a potential of each word line WL and a column decoder 13 controlling transfer gate 15.

A gate potential of two transistors 151, 152 connected to sense amplifier 14 is collectively controlled by column decoder 13.

An output of an X predecoder 8 and an output of a Y predecoder 9 in FIG. 7 are applied to row decoder 12 and column decoder 13, respectively.

Referring again to FIG. 7, an X address buffer 6 is controlled by a control circuit 11 so as to buffer external address signals $\phi1-\phi n$ to apply the same to X predecoder 8. A Y address buffer 7 is controlled by control circuit 11 so as to buffer external address signals $\phi1-\phi n$ to apply the same to Y predecoder 9 and an address change detecting circuit 10.

X predecoder 8 decodes the address signals from X address buffer 6 and supplies these decoded signals to row decoder 12 within each of blocks 101-108. Y predecoder 9 decodes the address signals from Y address buffer 7 and supplies the decoded signals to column decoder 13 (see FIG. 8) within each of blocks 101-108.

In data writing and data reading, external address signals $\phi1-\phi n$ are set such that one of output signals of row decoder 12 and one of output signals of column decoder 13 in only one block are at a high level and that all of output signals of row decoder 12 and column decoder 13 in the other blocks are at a low level.

Therefore, in any of the blocks (see FIG. 8), row decoder 12 further decodes the signals from X predecoder 8, and supplies a power supply potential Vcc corresponding to a high level only to one of word lines WL, and a ground potential corresponding to a low level to all the other word lines WL. This enables data writing and data reading to/from each memory cell MC connected to the word line WL.

If a potential of one word line WL is higher than a threshold voltage of transistor Tr in memory cell MC, the transistor Tr in each memory cell MC connected to the word line WL turns on and electrically connects capacitor C to a bit line BL1 or BL2 connected to memory cell MC. Therefore, if a potential of bit line BL1 or BL2 is high, capacitor C is charged and data "1" is written into memory cell MC. Conversely, if the potential of bit line BL1 or BL2 is low, capacitor C is not charged and data "0" is written into the memory cell MC.

Data writing is carried out by forcing bit line BL1 or BL2 to have a potential corresponding to an external write data Din. More specifically, in data writing, each sense amplifier 14 applies two signals from transfer gate 15 to two corresponding bit lines BL1, BL2, respectively.

If bit line BL1, BL2 are not forced to have such a potential, transistor Tr turns on. Therefore, when capacitor C is charged, a potential rise of bit line BL1 or BL2 connected to the transistor Tr occurs and when capacitor C is discharged, a potential fall occurs. As a result, a small potential difference is produced between two bit lines BL1, BL2 forming bit line pair BL. Data reading is then carried out by detecting and extracting the potential difference between bit lines BL1 and BL2. More specifically, in data reading, each sense amplifier 14 senses and amplifies the potential difference between two corresponding bit lines BL1, BL2 and applies two signals having complementary potentials to transfer gate 15.

Column decoder 13 further decodes the signal from Y predecoder 9 so as to apply a potential of a high level to gates of only two transistors of transistors 151, 152 in transfer gate 15 which are connected to one of sense amplifiers 14 and a potential of a low level to the gates of all the other transistors. As a result, only two transistors 151,152 connected to the sense amplifier 14 turn on and only this sense amplifier 14 is electrically connected to IO line pair 2.

IO lines 201 and 202 are forced to have complementary potentials corresponding to external data signal Din in data writing. In data reading, potentials of IO lines 201 and 202 are supplied to IO circuit 16 in FIG. 7 as one read data signal.

Therefore, in data writing, an external data signal is written into one memory cell MC connected to one word line WL having a potential of a high level (hereinafter referred to as a selected word line) and either of two bit lines (hereinafter referred to as selected bit lines) BL1, BL2 corresponding to one sense amplifier 14 connected to transistor pair 500 which are in an on-state.

In data reading, a potential difference between selected bit lines BL1 and BL2 produced by a stored data of one memory cell MC (hereinafter referred to as a selected memory cell) connected to the selected word line WL and the selected bit line BL1 or BL2 is amplified by sense amplifier 14 and appears between IO lines 201 and 202.

Therefore, in data writing, an external data is written into only one of the blocks, and in data reading, a data is read from only one of the blocks. By appropriately changing address signals $\phi 1-\phi n$, data writing and data reading can be carried out from/in a desired block to a memory cell at the desired location.

As shown in FIG. 7, corresponding to each of blocks 101-108, an equalizing circuit 4 and a pre-amplifier 3 are provided.

As shown in FIG. 8, both equalizing circuit 4 and pre-amplifier 3 are connected to IO lines 201, 202 of a corresponding block.

Each amplifier 3 is controlled by address change detecting circuit 10 so that, in data writing, it amplifies a signal supplied from IO circuit 16 and supplies complementary potentials to IO lines 201 and 202 of a corresponding block, and that, in data reading, it further amplifies a potential difference between IO lines 201 and 202 of the corresponding block and supplies the amplified difference to IO circuit 16.

Each equalizing circuit 4 is controlled by an equalization control signal generating circuit 5 so that, every time external address signals $\phi 1-\phi n$ change, IO lines 201 and 202 of the corresponding block are forced to have an equal potential.

IO circuit 16 is controlled by a control circuit 11 so that, in data writing, a signal corresponding to external write data Din is supplied to each pre-amplifier 3 and, in data reading, a signal from each pre-amplifier 3 is applied to an external terminal as a read data Dout.

Address change detecting circuit 10 detects the change of the address signals from an Y address buffer 7 and outputs a detection signal to all of pre-amplifiers 3 and equalization control signal generating circuit 5.

Each pre-amplifier 3 is activated in response to the detection signal. Equalization control signal generating circuit 5 is controlled by control circuit 11 such that, in data writing and data reading, circuit 5 generates equalization control signals EQ for activating equalizing circuit 4 in response to the detection signal. These equalization control signal EQ are commonly applied to all equalizing circuit 4. Therefore, whenever the next memory cell into which and from which data is to be written and to be read is selected, then each IO line pair 2 is equalized.

FIG. 9 is a circuit diagram showing a configuration of equalizing circuit 4. In FIG. 9, a configuration of one equalizing circuit is shown as a representative.

Referring to FIG. 9, each equalizing circuit 4 includes an N channel MOS transistor 40 connected between IO lines 201 and 202 of a corresponding block and receiving equalization control signal EQ at the gate. In each of data reading and data writing, whenever external address signals $\phi 1-\phi n$ change, equalization control signal EQ attains a high level. As a result, transistor 40 is turned on, data line 201 and data line 202 are electrically connected, and therefore these data lines 201, 202 have an equal potential.

Such equalization of IO lines is carried out in order that, when data is successively read from two different memory cells, for example, even if the levels of potentials of paired data lines 201 and 202, which are determined by the previously read data from one memory cell is opposite to a level corresponding to a stored data in a memory cell from which data is to be read, a proper potential appears rapidly and securely on IO lines 201 and 202 in the data reading.

Control circuit 11 controls a predetermined circuit portion such that, in response to an external control signal such as a low active, row address strobe signal RAS, a column address strobe signal CAS, a write enable signal WE, and an output enable signal OE and the like, a circuit operation for data writing, circuit operation for data reading, or a state in which neither data writing nor data reading is carried out (hereinafter referred to as an off time or a standby state) is achieved. Row active signals will be hereinbelow marked with /.

Referring to FIGS. 7 through 10, a circuit operation of data reading in the DRAM will be described in more detail.

FIG. 10 is a timing chart showing potential changes of main control signals and signal lines in data reading.

In this description, it is assumed that data is successively read out from a plurality of memory cells in the same row in the same block.

First, a row address strobe signal/RAS (FIG. 10A(a)) is lowered with external address signals $\phi 1-\phi n$ (FIG. 10(b)) indicating an address A1 supplied.

In response to the fall of row address strobe signal /RAS, X address buffer 6 operates, and, in one of the blocks 101-108 constituting memory cell array 1, a potential of one of word lines WL is raised to a high level, as shown in FIG. 10(c), by row decoder 12.

If a memory cell MC connected to the selected word line WL is connected to bit line BL1, as shown in FIG. 10(d), in response to the rise, each potential of bit lines BL1 slightly rises or falls depending on the stored data in the memory cell MC connected to the selected word line and the bit line BL1. Meanwhile each bit line BL2 does not change.

Conversely, if memory cell MC connected to the selected word line is connected to bit line BL2, in response to the rise, a slight potential rise or a slight potential fall occurs on each bit line BL2 depending on a stored data in one memory cell MC connected to the selected word line WL and the bit line BL2. Meanwhile, a potential of each bit line BL1 does not change.

Each sense amplifier 14 increases a slight potential difference produced as described above between bit lines BL1 and BL2 forming corresponding bit line pair BL to a magnitude of v as shown in FIG. 10(d). As a result, a potential of each bit line BL1 and a potential of bit line BL2 paired with the bit line BL1 are at complementary logic levels.

At the time when the potential difference between paired bit line BL1 and bit line BL2 is increased to a certain degree by a corresponding sense amplifier 14, Y address buffer 7 operates. As a result, a potential of any of output signal lines (hereinafter referred to as column selection lines) CSL of column decoder 13 of one block attains a high level, as shown in FIG. 10(e), at the time when the potential difference between paired bit line BL1 and BL2 is increased to the certain degree.

Therefore, depending on the potential of selected bit lines BL1 and BL2, potentials of data lines 201 and 202 change complementarily in response to the rise of the potential of the column selection line, as shown in FIG. 10(f).

That is, when the potential of selected bit line BL1 is at a high level, potentials of data lines 201 and 202 start to rise or fall, respectively, in response to the rise of the potential of the column selection line CSL. Conversely, if the potential of selected bit line BL1 is at a low level, potentials of IO lines 201 and 202 start to fall and rise, respectively, in response to the rise of the potential of column selection line CLS.

Thus, at the time when the potential difference between IO lines 201 and 202 is sufficiently increased, IO circuit 16 operates. As a result, the potential change on IO line pair 2, that is, stored data of the memory cell selected by address A1 is externally output without fail as a data signal of a logic value corresponding to the potential change.

External address signals φ1–φn are changed to signals indicating an address A2 in which a potential of a column selection line different from the one selected previously attains a high level.

Since the address change is detected by address change detection circuit 10, in response to the address change, as shown in FIG. 10(g), an equalization controlling signal EQ maintains a high level only in a ceratin period τ.

A change timing of external address signals φ1–φn is set so that equalization controlling signal EQ attains a high level after the potential difference between data lines 201 and 202 in the block from which data is read reaches the maximum value.

In the period when equalization controlling signal EQ is at a high level, IO lines 201 and 202 are electrically connected in each of blocks 101-108. As a result, in a block from which data is read, a potential of IO line 201 (or 202) which has risen and a potential of data line 202 (or 201) which has fallen start to fall and rise, respectively, in response to the rise of equalization controlling signal EQ, and eventually equalized to an intermediate potential Vcc/2 between power supply potential Vcc and a ground potential 0V (hereinafter referred to as an equalization potential).

In response to the change of external address signals φ1–φn, a potential of column selection line CSL different from the previous one attains a high level in the block from which data was previously read. As a result, depending on respective potentials of two bit lines BL1 and BL2 different from the previous ones, potentials of IO lines 201 and 202 start to change from the equalization potential as shown in FIG. 10(f).

When equalization controlling signal EQ is at a high level, the length of period τ is set such that before a potential of one column selection line CSL attains a high level, equalization controlling signal EQ falls to a low level. Therefore, by the circuit operation described above, stored data of one memory cell MC selected by address A2 is also supplied to a pre-amplifier 3 through sense amplifier 14 connected to selected bit line pair BL, transfer gate 15 and IO line pair 2.

As described above, in data reading, whenever external address signals φ1–φn are changed, equalization of data lines 201 and 202 in each block, release of the equalization in each block, signal transmission from one bit line pair BL to data line pair 2 in response to a rise of a potential of one column selection line CSL in one block are repeated.

In a semiconductor memory device having a memory cell array divided into blocks, original functions of the semiconductor memory device such as data writing and data reading are activated only in a particular block indicated by external address signals. Since none of the blocks except the particular block operates, power is scarcely consumed. Therefore, power consumption is reduced in operation of the semiconductor memory device.

An activated block will be hereinafter referred to as a block of a selected state. In a block of a non-selected state, IO lines 201 and 202 are not electrically connected to any of bit lines BL1, BL2, so that, as shown in FIG. 10(h), the IO lines are held at the equalization potential independent of a change of a potential level of equalization controlling signal EQ (FIG. 10(i)).

Although, the number of blocks of a selected state is 1 in the above description, the number may be more than one. In such a case, in data reading, data is read respectively from these plural blocks, and, in data writing, data is written into these plural blocks respectively.

As described above, in a conventional DRAM divided into blocks, an equalizing circuit for equalizing a data line is provided corresponding to each block, that is, corresponding to each IO line pair, and all equalizing circuits are controlled collectively by the same equalization controlling signal. As a result, in data reading, also in each of the blocks except the block of a selected state (hereinafter referred to as blocks of a non-selected state), equalization of a data line and release of the equalization are carried out.

That is, referring to FIGS. 7 through 10, in data reading, whenever external address signals φ1–φn change, equalization controlling signal EQ supplied to each equalization circuit 4 rises to a high level and then falls to a low level after a certain period τ. Therefore, in each of 8 blocks 101-108, whenever external address signals φ1–φn change, data lines 201 and 202 are electrically connected for the certain period of time, and then electrically cut off.

Such control of electrical connection state of data lines 201 and 202 in each block is performed by applying equalization controlling signal EQ to a gate of transistor 40 in equalizing circuit 4 corresponding to the block. A gate electrode of a MOS transistor is formed of polysilicon or the like on a semiconductor substrate with an insulating film interposed, so that a change of a potential applied to the gate of the MOS transistor causes charge/discharge current of a magnitude corresponding to a gate capacity to be generated at the gate.

Therefore, the charge/discharge current for charging/discharging the gate flows between the gate of transistor 40 in each equalizing circuit 4 and equalization control signal generating circuit 5.

When the gate capacity of transistor 40, potentials respectively corresponding to a high level and a low level of equalization control signal EQ, a period of a change of enteral address signals $\phi 1-\phi n$ and the number of times of changes of external address signals $\phi 1-\phi n$ in one read cycle (a period in which row address strobe signal/RAS falls to a low level and then recovers to a high level) are respectively represented as CG, VH and VL, tc, and N, and the number of blocks as B, a total current I generated in response to equalization control signal EQ in equalizing circuit 4 during one read cycle can be calculated by the following expression.

$$I[(CG \times |VH-VL| \times B) / tc] \times N$$

For example, if CG, VH, VL and tc are 0.4pF, 5V, 0V, 40ns, and 2 which are typical values, current I is $(0.1mA \times B)$.

The number of blocks in a memory cell array, that is the number of blocks B has been increasing in order to meet the demand of less power consumption and higher speed operation, as the number of the memory cells in each block increases due to recently advanced semiconductor memory device having higher integration density. That is, in FIG. 7, memory cell array 1 is divided into only 8 blocks, but these days a memory cell array is frequently divided into more blocks. For example, if the number of blocks B is 100, current I reaches 10mA.

In operation, the semiconductor memory device consumes current in many circuits other than such equalizing circuits. 10mA corresponds to a relatively large amount compared to consumed current in the whole semiconductor memory device.

Therefore, as the number of blocks increases, charge/discharge current of an equalizing circuit becomes too large to neglect as consumed current in operation of a semiconductor memory device and can be an important factor to increase power consumption in the semiconductor memory device. That is to say, charge/discharge current of an equalizing circuit produces a phenomenon which runs counter to a recent demand of less power consumption of a semiconductor memory device.

SUMMARY OF THE INVENTION

An object of the invention is to provide a semiconductor memory device whose power consumption in data reading is reduced.

Another object is to provide a semiconductor memory device having an accurate and high-speed data reading function.

Yet another object is to increase speed and accuracy of a data reading function of a semiconductor memory device without increasing power consumption.

Still another object of the invention is to provide a semiconductor memory device in which charge/discharge current due to equalization of an IO line pair is reduced.

Another object is to reduce power consumption of a block of a non-selected state in data reading within a semiconductor memory device having a memory cell array divided into blocks.

Yet another object is to provide a semiconductor memory device in which charge/discharge current due to equalization of an IO line pair is not increased even though the number of blocks is increased.

In order to achieve the above-described objects, a semiconductor memory device according to one aspect of the invention includes a plurality of blocks each including a plurality of memory cells, first and second output lines provided corresponding each of these plural block, equalizing circuitry provided corresponding to each of these plurality of blocks and equalizing the first and second output lines, selecting circuitry selecting any of the plurality of blocks in response to an address signal, and equalization controlling circuitry releasing equalization by the equalizing circuitry provided corresponding to the selected block in response to a change of the address signal in data reading.

First and second output lines provided corresponding to each block serve to externally transmit complementary data signals from the block.

Each equalizing circuitry equalizes first and second output lines of the corresponding block.

Each equalizing circuitry preferably includes a field effect semiconductor element having first and second conduction terminals connected to first and second output lines, respectively, of the corresponding block, and a control terminal. The equalization control circuitry controls a gate potential of each field effect semiconductor element.

According to another aspect of the invention, a semiconductor memory device includes a plurality of blocks each including a plurality of memory cells, a plurality of output line pairs provided corresponding to the plurality of blocks and each including first and second output lines serving to externally transmit complementary data signals from the corresponding block, selecting circuitry selecting any of the plurality of blocks in response to an address signal, a plurality of equalizing circuitry provided corresponding to the plurality of blocks and each equalizing first and second output lines of a corresponding block, detecting circuitry detecting a change of the address signal, and equalization control circuitry. In data reading, the equalization control circuitry enables the equalizing circuitry provided corresponding to a block selected by the selecting circuitry for a certain period of time in response to a detection output of the detecting circuitry and then disables it, and continues to enable the other equalizing circuitry regardless of the detection output.

A method for operating a semiconductor memory device in data reading, which includes a plurality of blocks each including a plurality of memory cells, and a plurality of output line pairs provided corresponding to the plurality of blocks and each including first and second output lines serving to externally transmit complementary data signals from the corresponding block, includes the steps of: selecting any one of the plurality of blocks in response to an address signal, equalizing first and second output lines provided corresponding to the selected block for a certain period of time in response to the detection, equalizing first and second output lines provided corresponding to each block except the selected one equalized regardless of the detection.

Since a semiconductor memory device according to the invention is structured as described above, in data reading, equalization is released in response to a change of an address signal only for one pair of a plurality of output line pairs provided corresponding to the block in a selected state. Therefore, each equalizing circuitry provided corresponding to the blocks in a non-selected state continues to be controlled such that it remains in the same state even if an address signal changes.

If each equalizing circuitry includes a field effect semiconductor element connected between corresponding first and second output lines, a gate potential of the field effect semiconductor element within the equalizing circuitry provided corresponding to a block in a non-selected state remains the same by the equalization control circuitry even if the address signal changes. Therefore, no current is consumed for charge/discharge of a control terminal of the equalizing circuitry corresponding to a block in a non-selected state.

Accordingly, since equalization of the output lines for reading data from a memory cell, according to the invention, is released only in a memory cell array block where the memory cell exists, charge/discharge current consumed for equalization of the output line pairs and its release is considerably reduced. As a result, even if charge/discharge current generated by equalization of the output line pairs and its release increases because of the increase of the number of divided blocks of the memory cell array, reduction of power consumption of a semiconductor memory device is not prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a timing chart in use for explaining an operation in data reading of a DRAM in FIG. 1.

DESCRIPTION OF THE PREFERRED EMBODIMENTS

Figure 1:
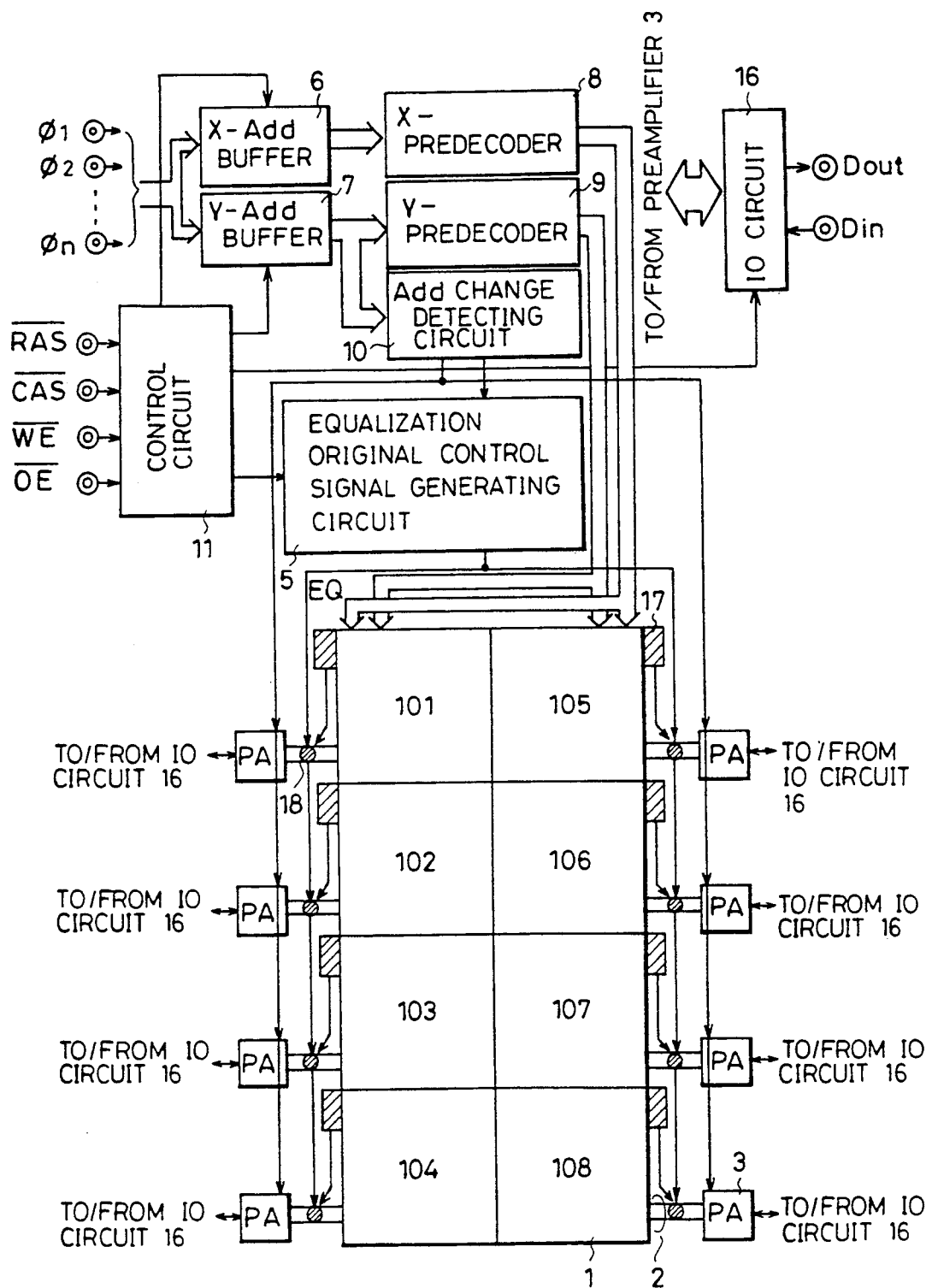
FIG. 1 is a schematic block diagram showing the whole structure of a DRAM of one embodiment according to the invention.

FIG. 1 is a schematic block diagram showing a whole configuration of a DRAM of one embodiment according to the present invention.

Figure 7:
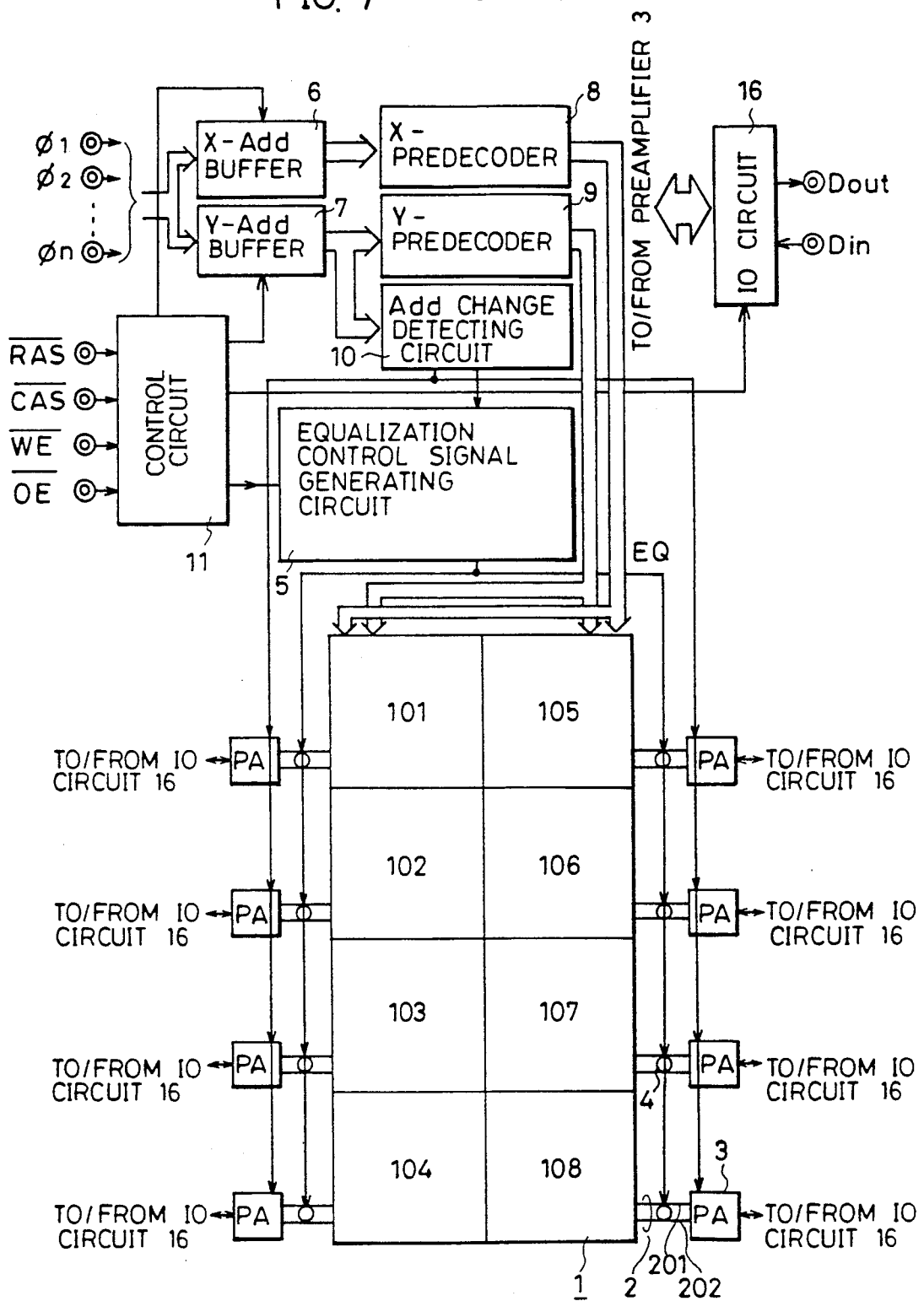
FIG. 7 is a schematic block diagram showing a whole configuration of a conventional DRAM divided into blocks.
Figure 8:
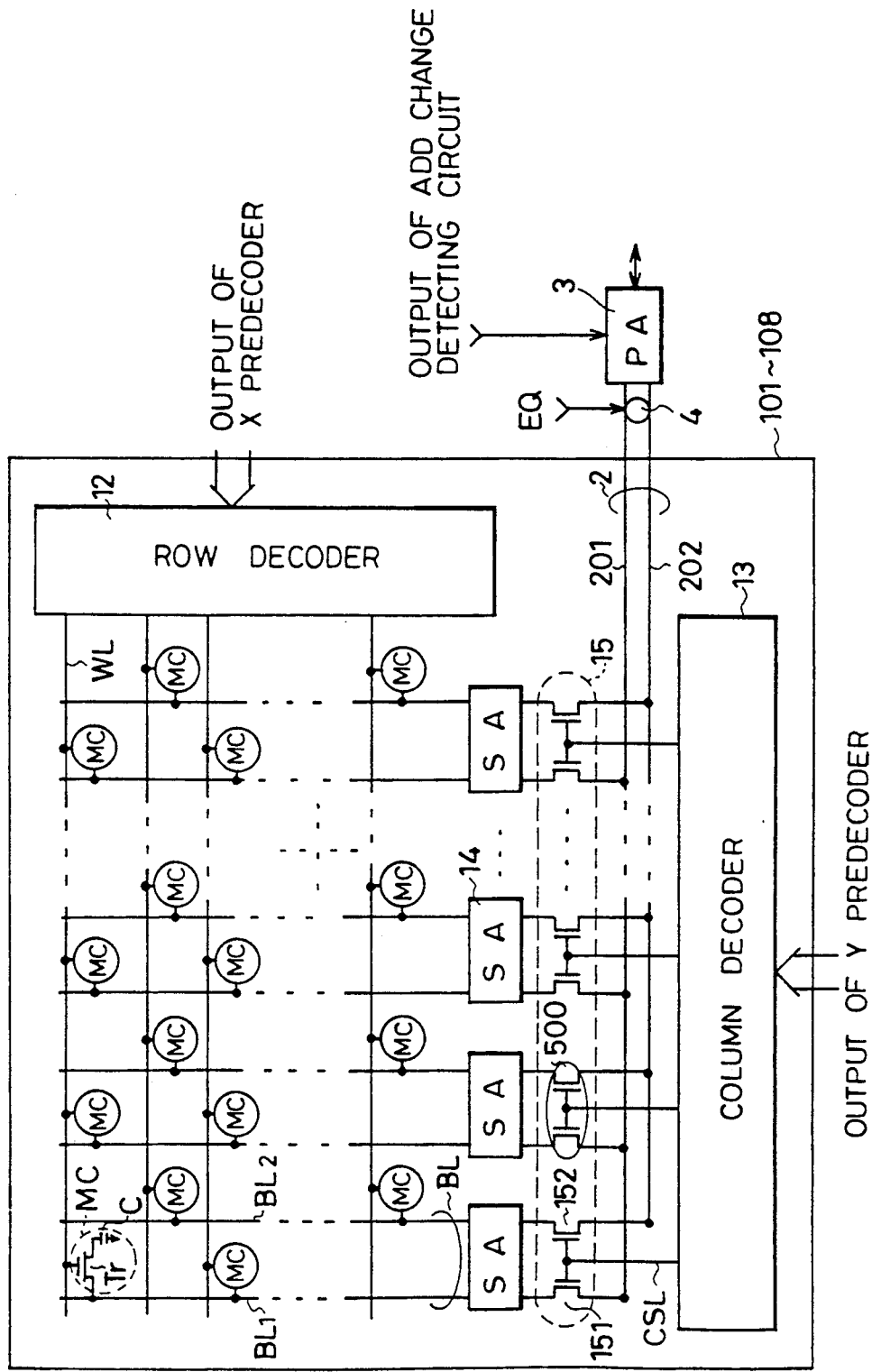
FIG. 8 is a circuit diagram showing an internal configuration of one of the blocks shown in FIG. 7.
Figure 9:
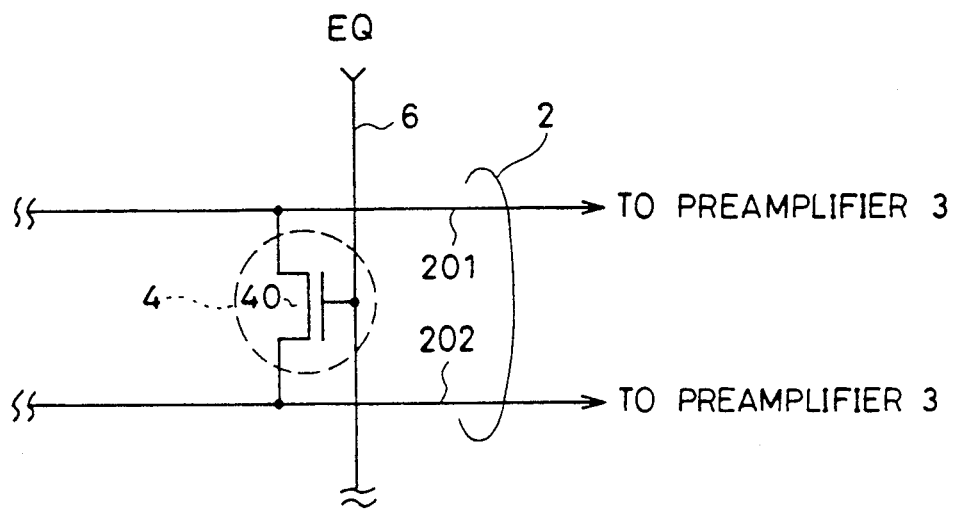
FIG. 9 is a circuit diagram showing a configuration of one of the equalizing circuit shown in FIG. 7.
Figure 10:
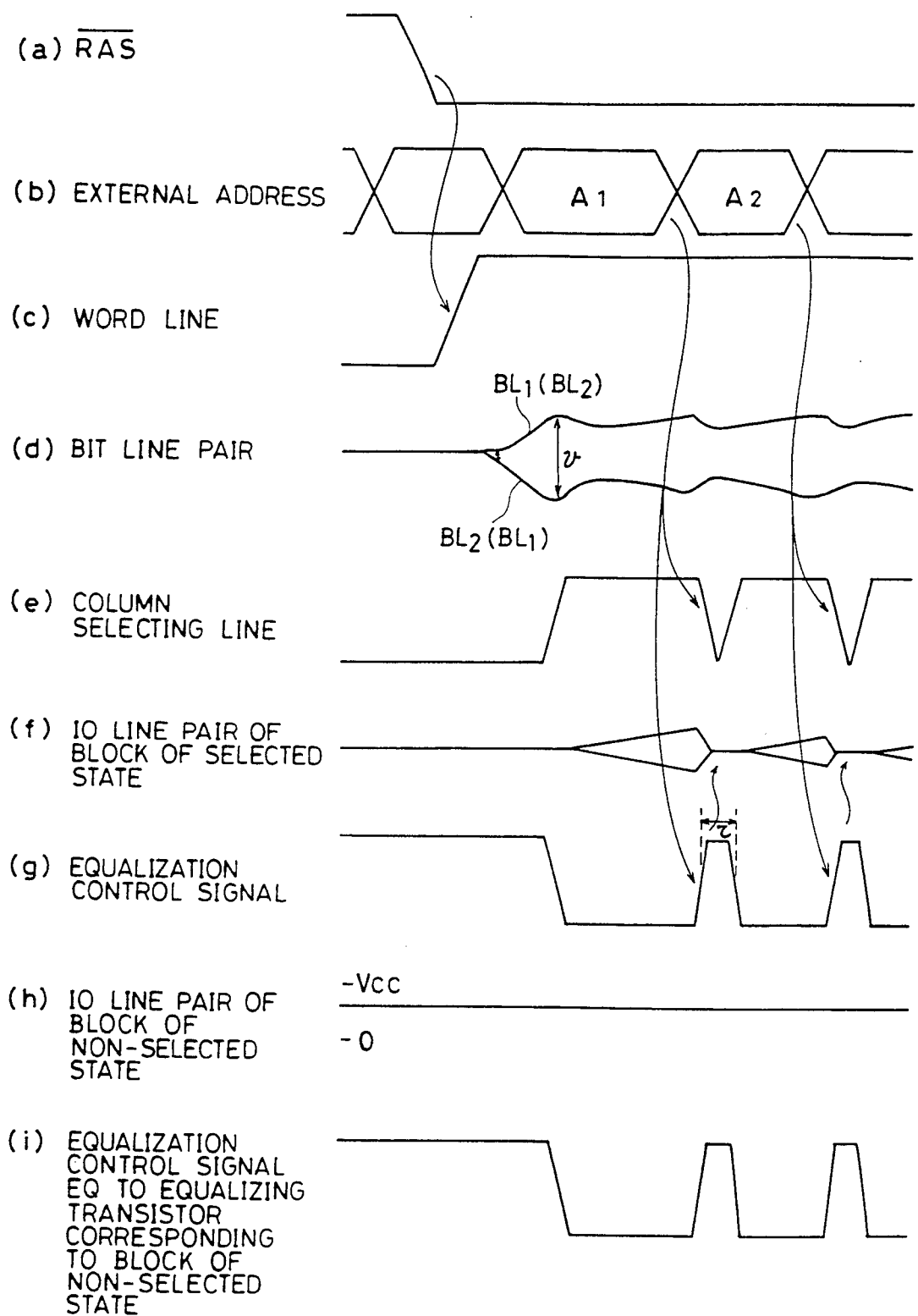
FIG. 10 is a timing chart in use for explaining an operation in data reading of a DRAM shown in FIG. 7.

Referring to FIG. 1, the DRAM includes eight selected block determining circuits 17 provided corresponding to all blocks 101-108, respectively, included in memory cell array 1 in addition to a configuration of a conventional DRAM shown in FIG. 7.

Unlike the conventional one, each equalizing circuit 18 is configured to be controlled by both an output signal of selected block determining circuit 17 provided corresponding to a corresponding block and an equalizing control signal EQ from equalization control signal generating circuit 5. Since configurations and operations of the other portions of the DRAM of the present embodiment are the same as those of the DRAM shown in FIG. 7, the description is not repeated.

Figure 2:
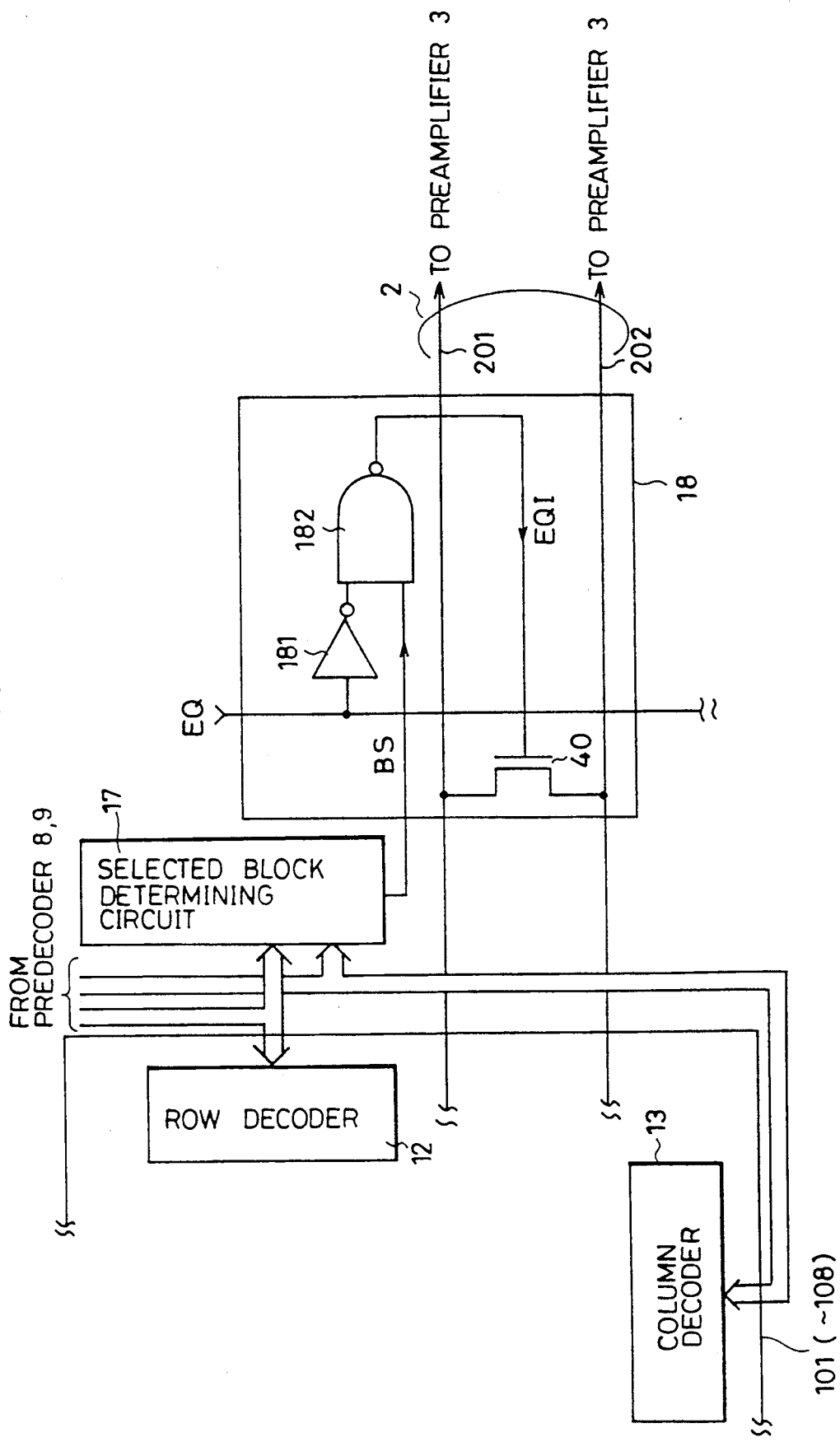
FIG. 2 is a circuit diagram showing the configurations of one of the equalizing circuits in FIG. 1 and the vicinity portions of the circuit.

FIG. 2 is a circuit diagram of a circuit showing a configuration of equalizing circuit 18 and a specific configuration on the periphery of selected block determining circuit 17. FIG. 2 shows only a portion corresponding to one block, as a representative.

Referring to FIG. 2, each selected block determining circuit 17 receives the same signals as the ones supplied from an X predecoder 8 and an Y predecoder 9 to a row decoder 12 and a column decoder 13 within a corresponding block, respectively. Each selected block determining circuit 17 decodes the received signals and determines if the corresponding block is in a selected state or not, and supplies a determination signal BS to a corresponding equalizing circuit 18.

Each equalizing circuit 18 includes an inverter 181 inverting equalization control signal EQ and an NAND gate 182 receiving an output signal from inverter 181 and determination signal BS from corresponding selected block determining circuit 17 as inputs, as well as an N channel MOS transistor 40 connected between data lines 201 and 202 of the corresponding block. An output signal EQI of NAND gate 182 is applied to a gate of transistor 40.

Therefore, equalization and its release of IO lines 201, 202 in each block are directly carried out not by equalization control signal EQ but by output signal EQI of NAND gate 182 in corresponding equalizing circuit 18.

In the present embodiment, each selected block determining circuit 17 outputs determination signal BS of a high level when a corresponding block is in a selected state, and determination signal BS of a low level when a corresponding block is in a non-selected state.

If output signal BS of selected block determining circuit 17 is at a high level, NAND gate 182 operates as an inverter inverting the output signal of inverter 181 in corresponding equalizing circuit 18. If output signal BS of selected block determining circuit 17 is at a low level, NAND gate 182 outputs a signal of a high level regardless of the level of the output signal of inverter 181 in a corresponding equalizing circuit 18. As a result, the gate of transistor 40 of each equalizing circuit 18 receives a potential of the same logic level as that of equalization control signal EQ only when a corresponding block is in a selected state, and when the corresponding block is in a non-selected state, always receives a potential of a high level regardless of equalization control signal EQ.

Therefore, equalization of data lines 201 and 202 in each of blocks 101-108 is carried out only for a certain period of time $\tau$ and then released, whenever external address signals $\phi 1$-$\phi n$ change, as in a conventional case, when the block is in a selected state. However, when a block is not selected, the equalization is not released even when external address signals $\phi 1$-$\phi n$ change.

FIG. 3 is a timing chart showing potential changes of main control signals and signal lines in data reading of a DRAM of the present invention. FIG. 3 shows an example when data is read successively from a plurality of memory cells MC arranged in one row within the same block.

In the DRAM of the present embodiment, since portions except selected block determining circuits 17 and equalizing circuits 18 operate as the conventional ones, row address strobe signal /RAS, external address signals φ1-φn, a potential of one word line WL in a block of a selected state, a potential difference between each bit line BL1 and the bit line BL2 paired with the bit line BL1 in a block of a selected state, a potential of column selecting line CSL in the block of a selected state, and potentials of IO lines 201 and 202 in the block of a selected state change as in the conventional case, and these changes are shown in FIGS. 3(a), (b), (c), (d), (e) and (f), respectively. Potentials of data lines 201 and 202 (FIG. 3(i)) do not change in a block of a non-selected state.

However, only in equalizing circuit 18 corresponding to a block of a selected state, that is, from which data is read, signal EQI represents the same potential change as that of equalization control signal EQ as shown in FIG. 3(h). In equalizing circuit 18 corresponding to a block of a non-selected state, that is, from which data is not read, signal EQI is always at a high level as shown in FIG. 3(c).

However, in a block of a selected state, equalization of IO lines 201 and 202 is released only a certain period of time τ after external address signals φ1-φn change for the purpose of data reading from a memory cell different from the one previously selected. As a result, in a block of a selected state, stored data of the selected memory cell appears on IO line pair 2 through a selected bit line pair BL, a sense amplifier 14 connected to the bit line pair BL, and transfer gate 15.

Unlike the conventional case, in a block of a non-selected state, equalization of IO lines 201 and 202 is not released even after external address signals φ1-φn change. However, in a block of a non-selected state, no stored data of any of memory cells MC needs to appear on IO line pair 2. Therefore, no problem arises even if equalization of IO lines 201 and 202 of a block of a non-selected state is not released.

Thus, in the present embodiment, among transistors 40 (hereinafter referred to as an equalizing transistor) connected to respective IO line pairs 2 of all blocks 101-108 for equalization of data lines 201, 202, only one transistor provided corresponding to a block in a selected state, has a gate potential changed in one reading cycle. As a result, current consumed for charge/discharge of the gates of equalizing transistors 40 in data reading is considerably reduced compared to the conventional case.

Figure 4:
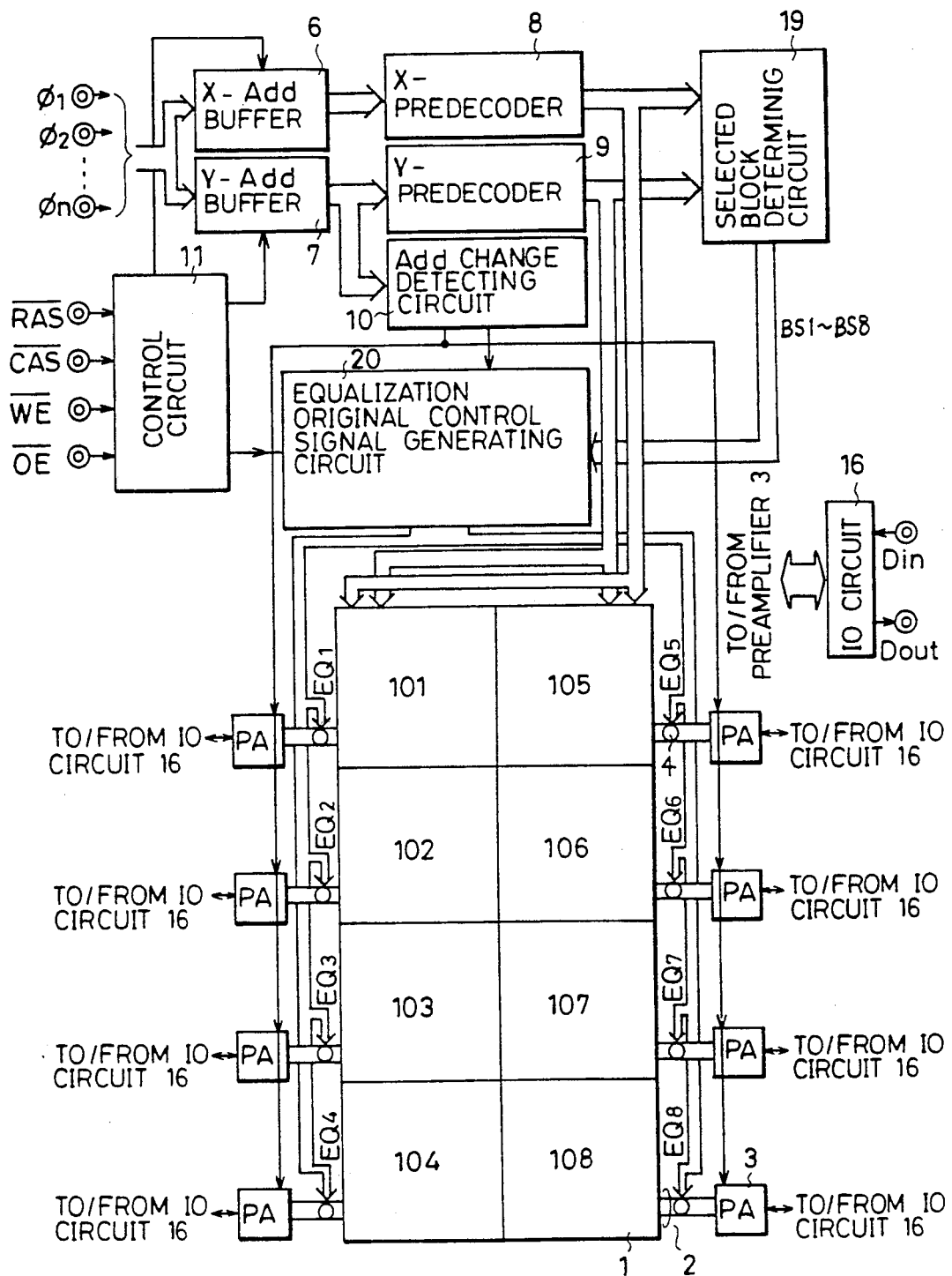
FIG. 4 is a schematic block diagram showing a whole configuration of a DRAM of another embodiment according to the present invention.

In the above embodiment, selected block determining circuit 17 is provided corresponding to each block for determining which block should be in a selected state, and each equalizing transistor 40 of the corresponding block is controlled by an output of the corresponding selected block determining circuit 17 independently of other equalizing transistors; however, a plurality of control signals respectively supplied to the gates of all equalizing transistors 40 may be generated collectively in order that each equalizing transistor 40 is controlled independently of the other equalizing transistors. FIG. 4 is a schematic block diagram showing a whole configuration of a DRAM in such a case, and shows another embodiment of the present invention.

Referring to FIG. 4, unlike the embodiment shown in FIG. 1, in the DRAM, an output signal of selected block determining circuit 19 is input to equalization control signal generating circuit 20, and respective equalization control signals EQ1-EQ8 are supplied to all equalizing circuit 4 from equalization control signal generating circuit 20.

Configurations and operations of the DRAM of the present embodiment are the same as those of the DRAM shown in FIG. 1 except those of selected block determining circuit 19, equalization control signal generating circuit 20, and equalizing circuit 4, and the description is not repeated.

Unlike the above-stated embodiment, selected block determining circuit 19 decodes output signals of X predecoder 8 and Y predecoder 9, so as to generate 8 signals BS1-BS8 showing whether or not each of blocks 101-108 of memory cell array 1 are in a selected state.

In the present embodiment, each of output signals BS1-BS8 of selected block determining circuit 19 indicates that the corresponding block is in a selected state, at a high level, and that the corresponding block is in a non-selected state, at a low level.

Equalization control signal generating circuit 20 is controlled by control circuit 11 such that, in data reading, only an equalization control signal to be supplied to equalizing circuit 4 corresponding to one block which is determined to be in a selected state by selected block determining circuit 19 attains a high level and the other seven equalization control signals all attain a low level in response to a detection signal from address change detecting circuit 10.

Figure 6:
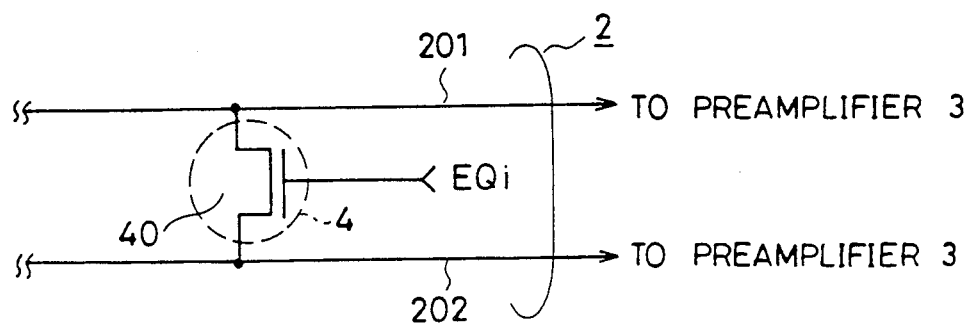
FIG. 6 is a circuit diagram showing a configuration of one of the equalizing circuits shown in FIG. 4.

FIG. 6 is a circuit diagram showing a configuration of each equalizing circuit 4. Only the configuration of one equalizing circuit 4 is shown in FIG. 6 as a representative.

Referring to FIG. 6, in the present embodiment, each equalizing circuit 4 is constituted only of N channel MOS transistor 40 connected between IO lines 201 and 202 of a corresponding block as in the conventional DRAM shown in FIG. 7.

Each of equalization control signals EQ1-EQ8 from equalization control signal generating circuit 20 is applied to the gate of the corresponding equalizing transistor 40.

Figure 5:
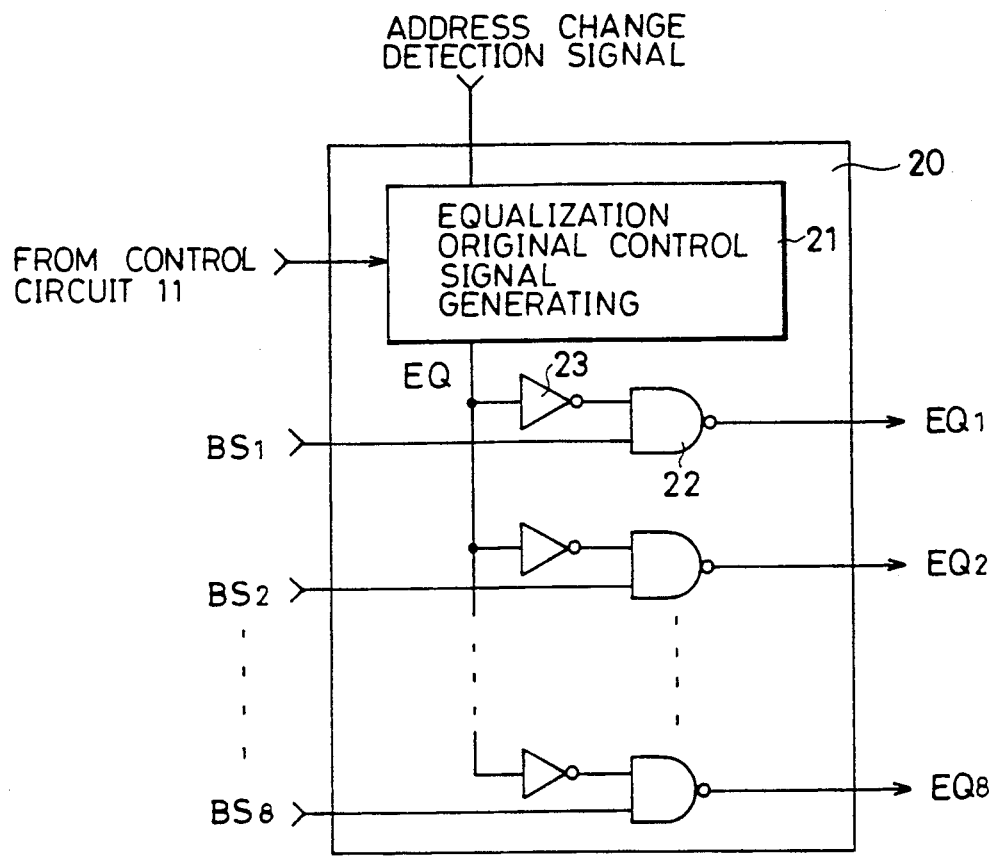
FIG. 5 is a circuit diagram showing an example of a configuration of a selection block determining circuit shown in FIG. 4.

FIG. 5 is a circuit diagram showing an example of configuration of equalization control signal generating circuit 20.

Referring to FIG. 5, equalization control signal generating circuit 20 includes, for example, an equalization original control signal generating circuit 21, and a NAND gate 22 and an inverter 23 provided corresponding to each of blocks 101-108.

Equalization original control signal generating circuit 21 is controlled by a control circuit 11 such that, in data reading, a signal whose level is high only in a certain period of time τ is generated in response to a detection signal from address change detecting circuit 10. That is, the same signal as the one generated from equalization control signal generating circuit 5 shown in FIG. 1, that is, equalization control signal EQ is generated from equalization original control signal generating circuit 21.

Each inverter 23 inverts output signal EQ of equalization original control signal generating circuit 21 and applies it to corresponding NAND gate 22.

Each NAND gate 22 receives an output signal of corresponding inverter 23 and one of output signals BS1-BS8 of selected block determining circuit 19, which one output signal shows the corresponding block is in a selected state or in a non-selected state. Output signals of respective NAND gates 22 are used as eight equalization control signals EQ1-EQ8.

Therefore, each of equalization control signals EQ1-EQ8 represents the same logic level as that of equalization control signal EQ, when a corresponding determination signal BS1-BS8 is at a high level, and it represents a high level regardless of a logic level of equalization control signal EQ when the corresponding determination signal is at a low level. That is, in data reading, only when a block is in a selected state, the corresponding one of equalization control signals EQ1-EQ8 attains a low level after a predetermined time in response to a detection signal from address change detecting circuit 10, when the block is in a non-selected state, it does not attain a low level even if address change detecting circuit 10 outputs the detection signal.

Therefore, each equalizing transistor 40 continues to equalize IO lines 201 and 202 of a corresponding block because of remaining at a high level of the gate potential, unless the corresponding block is in a selected state.

As a result, also in the present embodiment, the exactly same effect as in the above-stated embodiment can be obtained.

In any of the above embodiment, equalizing transistor 40 is an N channel MOS transistor; however, it may be a P channel MOS transistor. Of course, in such a case, selected block determining circuits 17, 19 and equalization control signal generating circuits 5, 20 are structured so that a control signal supplied to a gate of each equalizing transistor attains a high level after a predetermined time in response to a detection signal from address change detecting circuit 10 when a corresponding block is in a selected state, and remains at a low level regardless of generation of the detection signal from address change detecting circuit 10 when the corresponding block is in a non-selected state.

Even if the number of blocks simultaneously to be activated in data reading and data writing is more than one, the same effect as in the above embodiment can be obtained.

Although, in the above embodiments, an input line for receiving external data in data writing and an output line for externally transmitting read data in data reading are formed of common signal lines (IO line pair 2), the present invention can be applied to a device in which these lines are formed of different signal lines.

The present invention is applicable to not only a DRAM having a memory cell array divided into 8 blocks, but also a semiconductor memory device in general in which a memory cell array is divided into a plurality of blocks and each output line pair needs to be equalized.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A dynamic random access memory, comprising:
   a plurality of blocks each including a plurality of memory cells arranged in a matrix of a plurality of rows and columns;
   a plurality of output line pairs provided corresponding to said plurality of blocks and each including first and second output liens serving to externally transmit complementary data signals from a corresponding block;
   selecting means for selecting any of said plurality of blocks in response to a row address signal;
   a plurality of equalizing means provided corresponding to said plurality of blocks and each equalizing the first and second output lines of the corresponding block; and
   equalizing control means for releasing equalization of the first and second output lines only of the block selected by said selecting means in response to a change of a column address signal in data reading.

2. The semiconductor memory device according to claim 1, wherein
   each of said plurality of equalizing means includes a field effect semiconductor element having first and second conduction terminals respectively connected to first and second output lines constituting a corresponding output line pair, and a control terminal and;
   said equalizing control means controls a potential of the control terminal of said field effect semiconductor element.

3. The semiconductor memory device according to claim 1, wherein
   said equalization control means comprises
   address change detecting means for detecting a change of said address signal;
   designation signal generating means for generating a designation signal designating release of said equalization at a predetermined timing in response to a detection output of said address change detecting means; and
   a plurality of determination means provided corresponding to said plurality of blocks and each determining whether or not a corresponding block is said selected block in response to an output of said selecting means.

4. The semiconductor memory device according to claim 3, wherein
   each of said plurality of equalizing means controls an electrical connection between first and second output lines constituting a corresponding output line pair in response to a determination output of a corresponding determining means and said designation signal.

5. The semiconductor memory device according to claim 4, wherein
   each of said plurality of equalizing means comprises
   a switching element connected between first and second output lines constituting the corresponding output line pair; and
   control signal generating means for generating a control signal controlling turning on/off of said switching element in response to the determination output of the corresponding determining means and said designation signal.

6. The semiconductor memory device according to claim 5, wherein
   said control signal generating means comprises
   a logic circuit for generating a first control signal which turns the corresponding switching element off in response to said designation signal when a determination output of a corresponding determining means indicates that a corresponding block is said selected block, and for generating a second control signal which turns the corresponding switching element on regardless of said designation signal when the determination output of the corresponding determining means indicates that the corresponding block is not said selected block.

7. The semiconductor memory device according to claim 6, wherein
said logic circuit means includes inverter means for inverting said indication signal and 2 input NAND gate means for receiving an output of said inverter means and the determination output of the corresponding determining means,
said designation signal representing a first logic level; and
each of said plurality of determining means generates the determination output of a second logic level when the corresponding block is said selected block, and generates the determination output of said first logic level when the corresponding block is not said selected block.

8. The semiconductor memory device according to claim 6, wherein said switching element comprises a field effect semiconductor element having a control terminal receiving an output of the corresponding logic circuit means, a first conduction terminal connected to the corresponding first output line, and a second conduction terminal connected to the corresponding second output line.

9. The semiconductor memory device according to claim 1, wherein
said equalization controlling means comprises
address change detecting means for detecting a change of said address signal;
determining means for determining which one of said plurality of blocks is said selected block in response to an output of said selected means; and
control signal generating means for generating a plurality of control signals respectively controlling said plurality of equalizing means in response to the determination output of said determining means and the detection output of said address change detecting means.

10. The semiconductor memory device according to claim 9, wherein the control signal corresponding to said selected block attains a level at which a corresponding equalizing means is disabled at a predetermined timing in response to the detection output of said address change detecting means, and each of other control signals are held at a level at which a corresponding equalizing means is enabled regardless of the detection output of said address change detecting means.

11. The semiconductor memory device according to claim 10, wherein
the determination output of said determining means is generated corresponding to said plurality of blocks and includes a plurality of determination signals each indicating whether or not a corresponding block is said selected block; and
said control signal generating means comprises
designation signal generating means for generating a designation signal designating release of said equalization at said predetermined timing in response to the detection output of said address change detecting means, and
a plurality of logic circuit means provided corresponding to said plurality of equalizing means and each generating a corresponding control signal in response to a corresponding determination signal and said designation signal.

12. The semiconductor memory device according to claim 11, wherein each of said plurality of equalizing means includes a switching element connected between the corresponding first and second output lines, and controlled by the corresponding control signal.

13. The semiconductor memory device according to claim 11, wherein said switching element comprises a field effect semiconductor element having a first conduction terminal connected to the corresponding first output line, a second conduction terminal connected to the corresponding second output line and a control terminal receiving the corresponding control signal.

14. A dynamic random access memory, comprising:
a plurality of blocks each including a plurality of memory cells arranged in a matrix of a plurality of rows and columns;
a plurality of output lines pairs provided corresponding to said plurality of blocks and each including first and second output lines for serving to externally transmit complementary data signals from a corresponding block;
selecting means for selecting any of said plurality of blocks in response to a row address signal;
a plurality of equalizing means provided corresponding to said plurality of blocks and each equalizing the first and second output liens of the corresponding block;
detecting means for detecting a change of a column address signal; and
equalization controlling means for enabling equalizing means provided corresponding to the block selected by said selecting means for a predetermined time after said change of the column address signal and then disabling it, and for enabling other equalizing means regardless of said detecting means, in data reading.

15. The semiconductor memory device according to claim 13, wherein
each of said plurality of equalizing means includes a switching element connected between the corresponding first and second output lines, and
said equalizing control means includes logic circuit means for generating a signal controlling on/off of said switching element in response to an output of said selecting means and an output of said address change detecting means.

16. A dynamic random access memory, comprising:
a plurality of memory cell blocks each including a plurality of emory cells arranged in a matrix of a plurality of rows and columns;
a plurality of output line pairs provided corresponding to said plurality of memory cell blocks and each transmitting complementary data signals based on data read from a selected memory cell of a corresponding memory cell block;
a plurality of equalizing means provided corresponding to said plurality of output line pairs and each equalizing a corresponding output line pair; and
releasing means for releasing equalization of the output line in the block having the selected memory cell.

17. A method of operating a semiconductor memory device in data reading which comprises a plurality of blocks each including a plurality of memory cells arranged in a matrix of a plurality of rows and column, and a plurality of output line pairs provided corresponding to said plurality of blocks and each including first and second output lines serving to externally transmit complementary data signals from a corresponding block, comprising the steps of:

selecting any of said plurality of blocks in response to a row address signal;

detecting a change of a column address signal;

equalizing first and second output lines provided corresponding to said selected block for a certain period of time after said change and releasing said equalized output lines; and equalizing the first and second output lines provided corresponding to each of the blocks except said selected block regardless of said detection.

* * * * *